(12) United States Patent
Yegnashankaran

(10) Patent No.: US 6,881,943 B1
(45) Date of Patent: Apr. 19, 2005

(54) CONVEX IMAGE SENSOR AND METHOD OF FORMING THE SENSOR

(75) Inventor: Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 114 days.

(21) Appl. No.: 10/281,836

(22) Filed: Oct. 28, 2002

(51) Int. Cl.[7] .............................................. H01L 27/00
(52) U.S. Cl. ..................... 250/208.1; 156/160; 438/118
(58) Field of Search .......................... 250/208.1, 214.1, 250/239; 156/160, 165; 438/118, 66, 457; 257/431, 433

(56) References Cited

U.S. PATENT DOCUMENTS 5,510,273 A * 4/1996 Quinn ........................ 156/160
6,752,888 B1 * 6/2004 Hosier et al. ............... 156/160

OTHER PUBLICATIONS

Visvamohan Yegnashankaran and Gobi R. Padmanabhan, U.S. Appl. No. 10/004,977, filed Dec. 3, 2001, pps. 1–34.

Ashok Prabhu, U.S. Appl. No. 10/153,974, filed May 2, 2002, pps. 1–20.

* cited by examiner

*Primary Examiner*—Kevin Pyo
(74) *Attorney, Agent, or Firm*—Mark C. Pickering (57) ABSTRACT

An image sensor has a core structure with a convex surface, such as a sphere or a tube. The image sensor also has an interconnect layer that is adhered to the convex surface of the core structure, and a photo-sensing layer that is connected to the interconnect layer. The photo-sensing layer collects photo-information, while the interconnect layer provides an electrical interface between the photo-sensing layer and the outside world.

25 Claims, 9 Drawing Sheets

CONVEX IMAGE SENSOR AND METHOD OF FORMING THE SENSOR

BACKGROUND OF THE INVENTION

1. Field of the Invention

The present invention relates to an image sensor and, more particularly, to a convex image sensor and a method of forming the sensor.

2. Description of the Related Art

The rigidity of a semiconductor wafer (the resistance of the wafer to deformation) is reduced significantly as the thickness of the wafer is reduced. For example, when the thickness of a semiconductor wafer is approximately one mil, the wafer can be deformed. One application of a very thin wafer is as the photo-sensing element of an optical image sensor.

Figure 1:
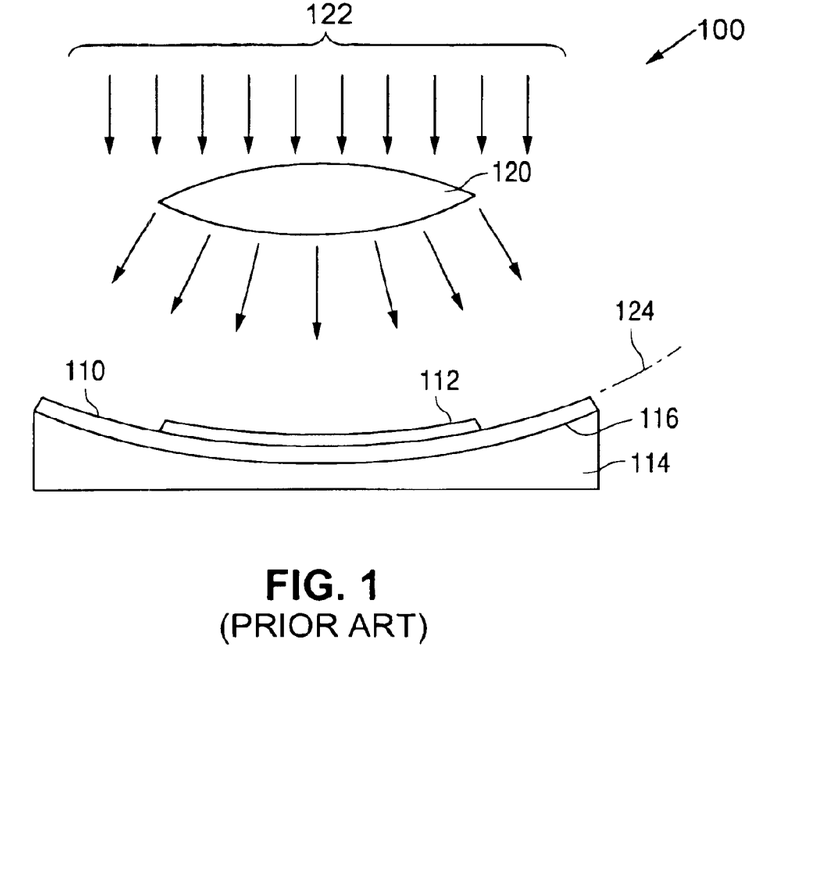
FIG. 1 is a cross-sectional diagram illustrating a prior art optical image sensor 100.

FIG. 1 shows a cross-sectional diagram that illustrates a prior art optical image sensor 100. As shown in FIG. 1, optical image sensor 100 includes a very thin wafer 110, and an array of photodiodes and associated photo-sensing circuitry 112 that are formed on wafer 110. Imager 100 also includes a base structure 114 that has a concave surface 116 that supports wafer 110.

In addition, image sensor 100 also includes a single low-cost lens 120 that focuses incoming light 122 on a curved focal plane 124. Curved focal plane 124, in turn, has a convex outer shape that approximately matches the shape of concave surface 116. As a result, the non-rigid structure of a very thin wafer allows the array of photodiodes to be placed on the curved focal plane 124 of low-cost lens 120, thereby forming a low-cost imager with a substantially improved optical quality.

SUMMARY OF THE INVENTION

The present invention provides a convex image sensor and a method of forming the sensor. The image sensor includes a core structure that has a convex surface, and an interconnect layer that is adhered to the convex surface of the core structure. The interconnect layer routes voltages and signals from a surface region to an external connection region.

The image sensor also includes a plurality of solder bumps, and a photo-sensing layer that is connected to the surface region of the interconnect layer via the plurality of solder bumps. The photo-sensing layer has a plurality of photocells that output voltages that correspond to an intensity of light received by the photocells.

The present invention also includes a method of forming an image sensor. The method includes the steps of forming a core structure having a convex surface, and adhering an interconnect layer to the convex surface of the core structure. The interconnect layer routes voltages and signals from a surface region to an external connection region. In addition, the method also includes the step of connecting a photo-sensing layer to the surface region of the interconnect layer. The photo-sensing layer has a plurality of photocells that output voltages that correspond to an intensity of light received by the photocells.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 2A–2B are views illustrating an example of a spherical image sensor 200 in accordance with the present invention.

FIGS. 4A–4B are views illustrating an example of a portion of a photocell formed in a photo-sensing section 400 in accordance with the present invention. FIG. 4A is a bottom view, while

DETAILED DESCRIPTION OF THE INVENTION

Figure 2A:
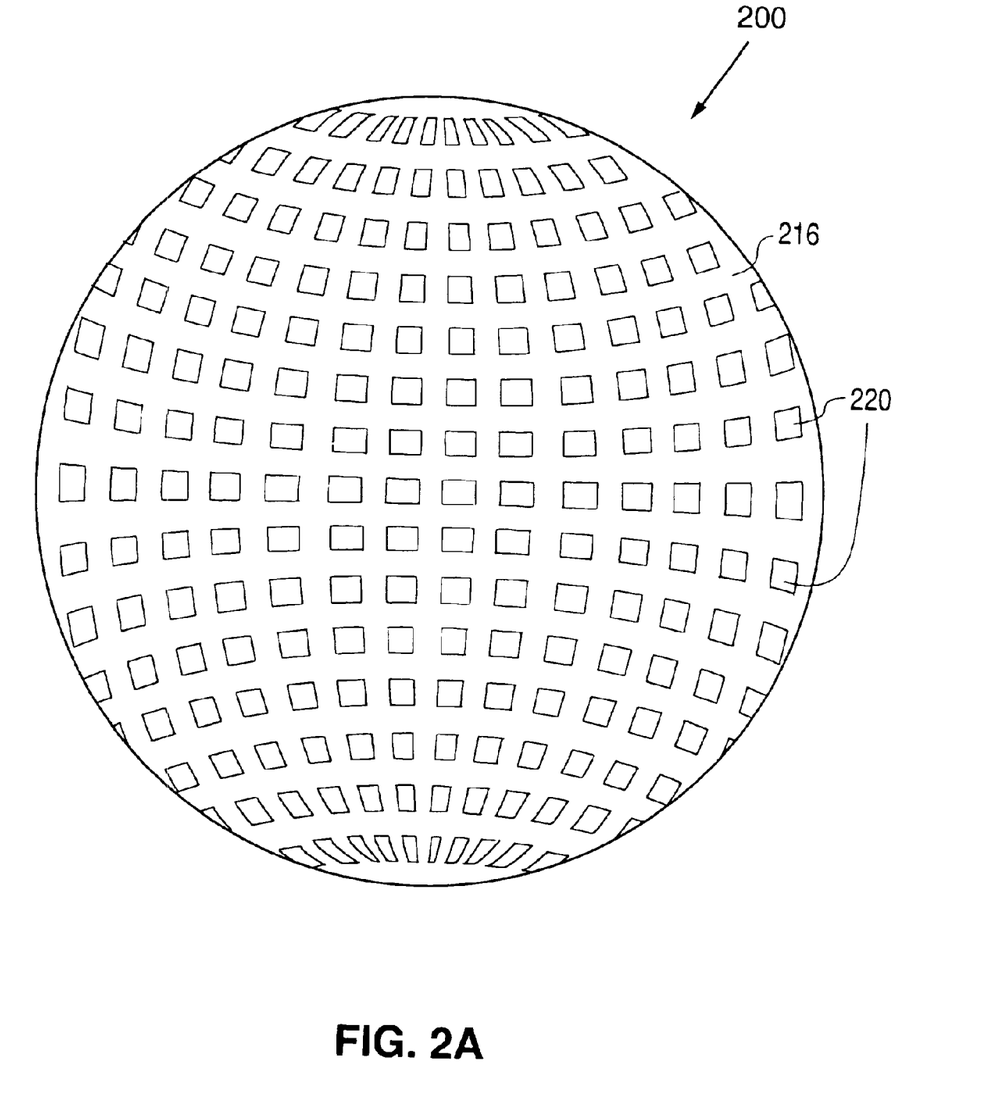
FIG. 2A is a perspective view.
Figure 2B:
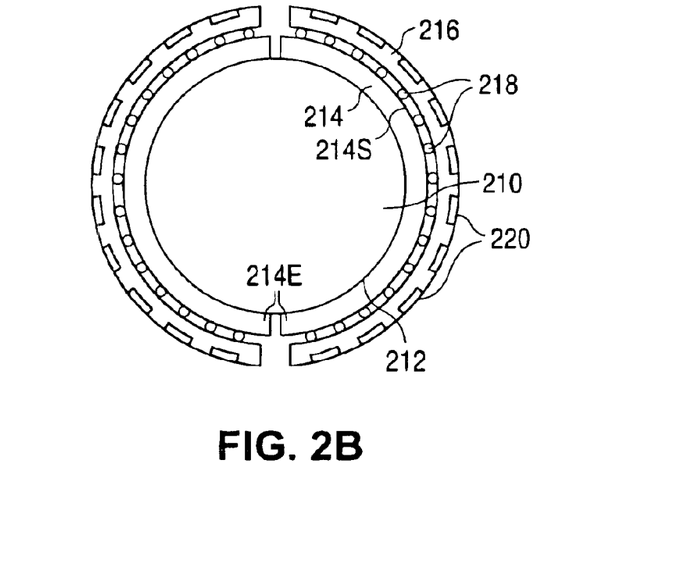
FIG. 2B is a cross-sectional view.

The present invention is directed to convex image sensors, such as spherical and tubular sensors. FIGS. 2A–2B show views that illustrate an example of a spherical image sensor 200 in accordance with the present invention. FIG. 2A shows a perspective view, while FIG. 2B shows a cross-sectional view.

As shown in FIGS. 2A–2B, spherical image sensor 200 includes a core structure 210 that has a convex surface 212, and an interconnect layer 214 that is adhered to the convex surface 212 of core structure 210. Interconnect layer 214 routes voltages and signals from a surface region 214S to an external connection region 214E.

In addition, image sensor 200 includes a photo-sensing layer 216 that is connected to the surface region 214S of interconnect layer 214 via a number of solder bumps 218. (In addition to solder, solder bumps 218 can alternately be implemented with other adhesives that electrically and mechanically connect photo-sensing layer 216 to interconnect layer 214.) Photo-sensing layer 216 includes a number of photocells 220 that output voltages that correspond to the intensity of light received by the photocells 220.

Figure 3:
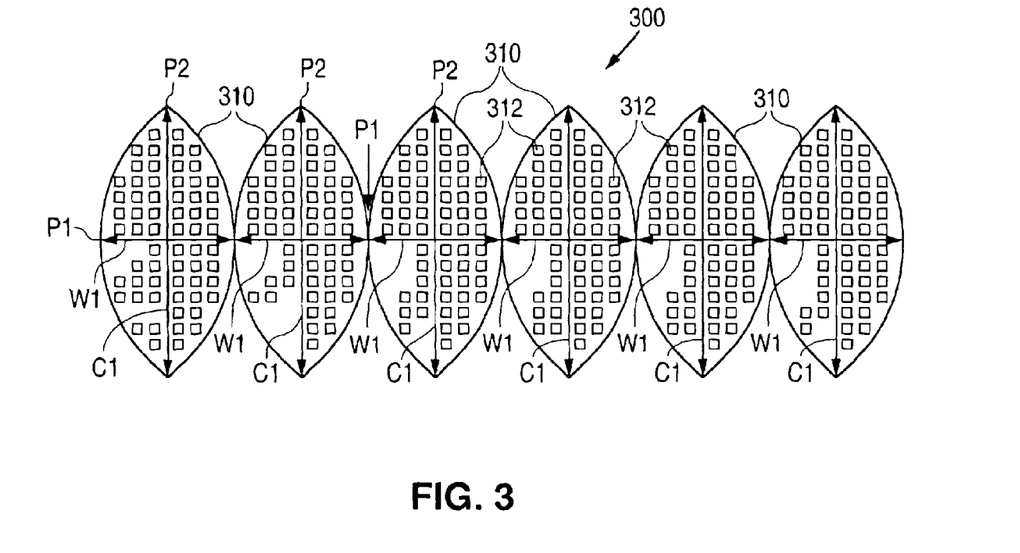
FIG. 3 is a plan view illustrating an example of a photo-sensing layer 300 in accordance with the present invention.

FIG. 3 shows a plan view that illustrates an example of a photo-sensing layer 300 in accordance with the present invention. As shown in FIG. 3, photo-sensing layer 300 includes a series of adjacent photo-sensing sections 310. When adjacent photo-sensing sections 310 are connected together, and the first and last photo-sensing sections 310 are connected together, the connected sections 310 form a sphere.

Each photo-sensing section 310 has a maximum width line W1, and a centerline C1 that passes through the center of the maximum width line W1, and is normal to, and longer than, the maximum width line W1. In addition, each section 310 has a curved edge that runs from a point P1 at an end of the maximum width line W1, to a point P2 at an end of the centerline C1.

Figure 4A:
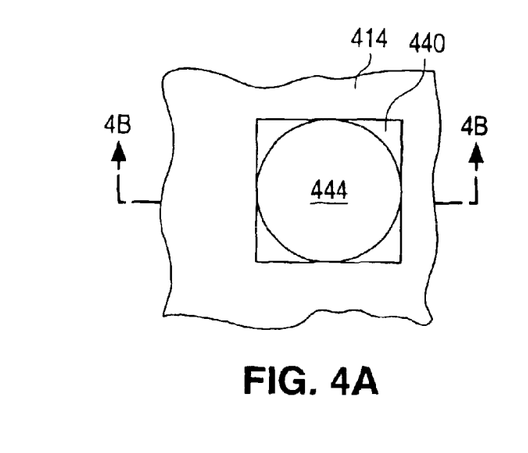
Figure 4B:
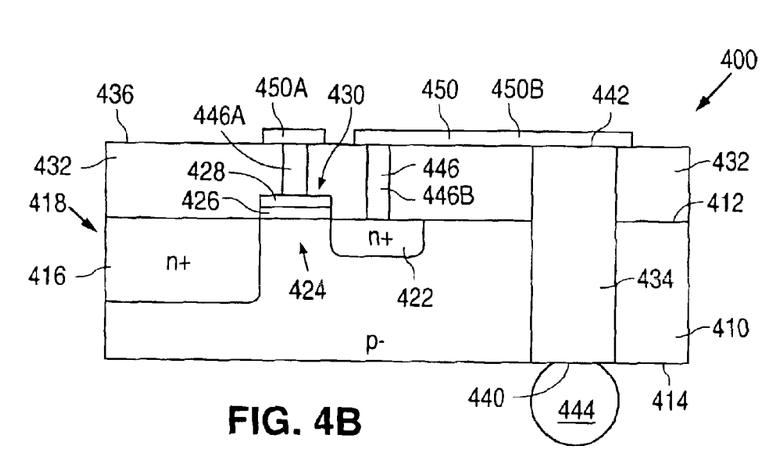
FIG. 4B is a cross-sectional view taken along line 4B—4B in FIG. 4A.

Each photo-sensing section 310 also includes an array of photocells 312 that convert incident light into voltages that represent the intensity of the light that was received. The photocells 312 can be implemented as, for example, active pixel sensor cells. FIGS. 4A–4B show views that illustrate an example of a portion of a photocell formed in a photo-sensing section 400 in accordance with the present invention. FIG. 4A shows a bottom view, while FIG. 4B shows a cross-sectional view taken along line 4B—4B in FIG. 4A.

As shown in FIGS. 4A–4B, photo-sensing section 400 includes a p-type semiconductor wafer 410 with a top surface 412 and a bottom surface 414, and a n+ region 416 that is formed in wafer 410. Wafer 410 is very thin and can be, for example, approximately one mil thick. Together, n+ region 416 and p– wafer 410 form a n+/p– photodiode 418. (The present invention can be utilized with other photodiode structures, including color photodiodes that use a number of vertically-stacked photodiodes.)

In addition, photo-sensing section 400 also includes a n+ drain region 422 that is formed in p– wafer 410, and a channel region 424 that is located between n+ region 416 and drain region 422. Section 400 further includes a gate oxide layer 426 that is formed on wafer 410 over channel region 424, and a gate 428 that is formed on gate oxide layer 426 over channel region 424. Together, n+ region 416, n+ drain region 422, channel region 424, gate oxide layer 426, and gate 428 form a NMOS transistor 430.

In addition, photo-sensing section 400 includes a layer of isolation material 432 that is formed on the top surface 412 of wafer 410, and a conductive region 434 that extends through wafer 410 and isolation material 432. Isolation material 432 has a top surface 436, while conductive region 434, which can include metal, has a bottom surface 440 and a top surface 442.

In the example of FIGS. 4A–4B, the bottom surface 414 of wafer 410 and the bottom surface 440 of conductive region 434 lie substantially in the same plane. In addition, the top surface 436 of isolation material 432 and the top surface 442 of conductive region 434 lie substantially in the same plane. Further, a solder bump 444 is connected to bottom surface 440 of conductive region 434.

Photo-sensing section 400 additionally includes a number of contacts 446, including contacts 446A and 446B, that are formed through isolation layer 432. In the example of FIGS. 4A–4B, contacts 446A and 446B are formed through isolation layer 432 to make an electrical connection with gate 428 and n+ drain region 422, respectively.

Further, section 400 includes a number of metal-1 traces 450, including metal-1 traces 450A and 450B, that are formed on isolation layer 432 to make an electrical connection with contacts 446. In the example of FIGS. 4A–4B, metal-1 trace 450A is connected to contact 446A, while metal-1 trace 450B is connected to contact 446B and conductive region 434. (Metal-1 trace 450B is but one example of connecting drain region 422 to conductive region 434. A metal-2 trace or a trace from any subsequent metal layer can alternately be used with interconnecting vias.)

FIGS. 5A–5J show cross-sectional views that illustrate a method of forming a conductive region in accordance with the present invention. As shown in FIGS. 5A–5J, the method, which utilizes a conventionally formed wafer 510 that has a doped region 512, begins by forming a layer of masking material 514 on wafer 510. Once formed, material 514 is patterned to expose a number of trench areas on the top surface of wafer 510.

Figure 5A:
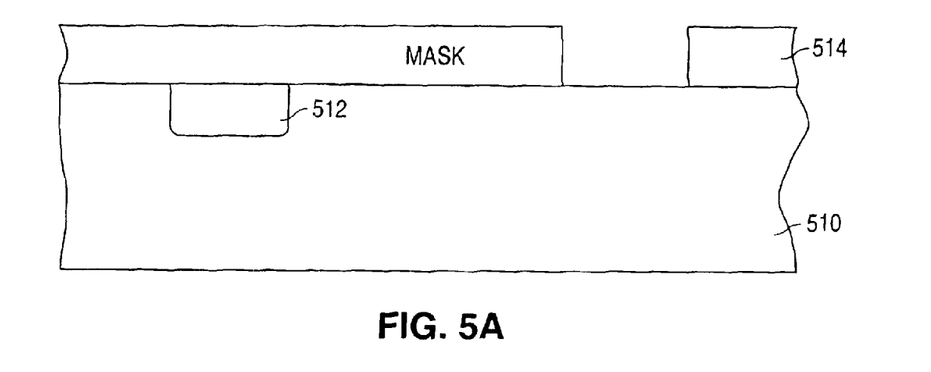
FIGS. 5A–5J are cross-sectional views illustrating a method of forming a conductive region in accordance with the present invention.
Figure 5B:
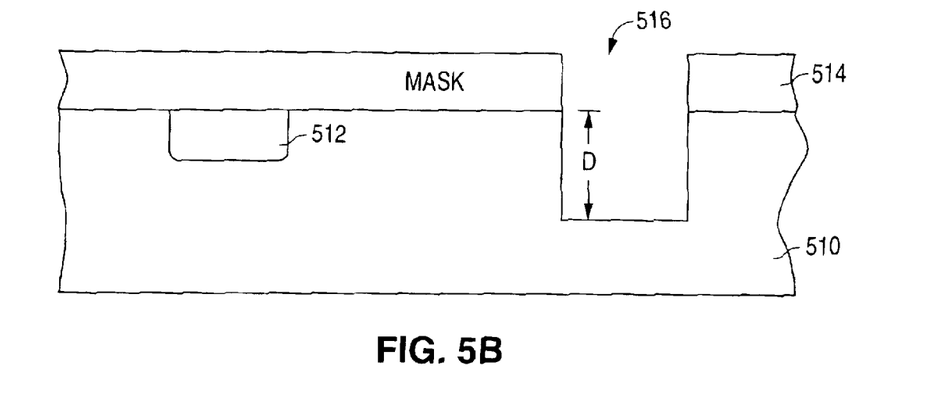

Referring to FIG. 5B, once masking material 510 has been formed, the trench area of wafer 510 is anisotropically etched until a trench 516 has been formed in wafer 510. Trench 516 can be formed to have a variety of shapes by utilizing both anisotropic and isotropic etches.

Trench 516 is formed to have a depth D that is greater than a final thickness of wafer 510. For example, if the final thickness of wafer 510 is one mil (1 mil=25.4 microns), then trench 516 is formed to have depth D that is greater than one mil. Following the etch, masking material 514 is removed.

Figure 5C:
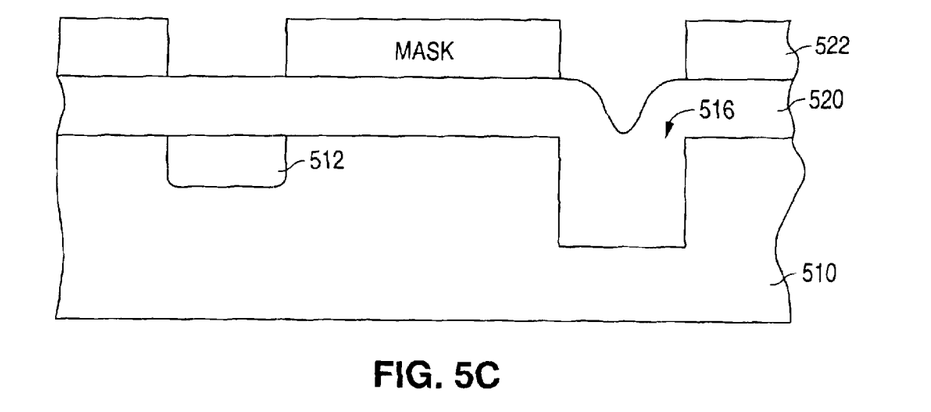

Referring to FIG. 5C, after masking material 514 has been removed, a layer of insulation material 520 is formed over wafer 510, including doped region 512 and trench 516. Insulation layer 520 can include, for example, a first layer of oxide approximately 1000 Å thick that is formed over wafer 510, and a layer of polysilicon-doped spin-on-glass (PSG) approximately 4000 Å thick that is formed on the first oxide layer. In addition, material 520 can also include a second layer of oxide approximately 8000 Å thick that is formed on the PSG layer. The first and second layers of oxide, in turn, can be formed using plasma-enhanced chemical-vapor-deposition (PECVD) processes.

Figure 5D:
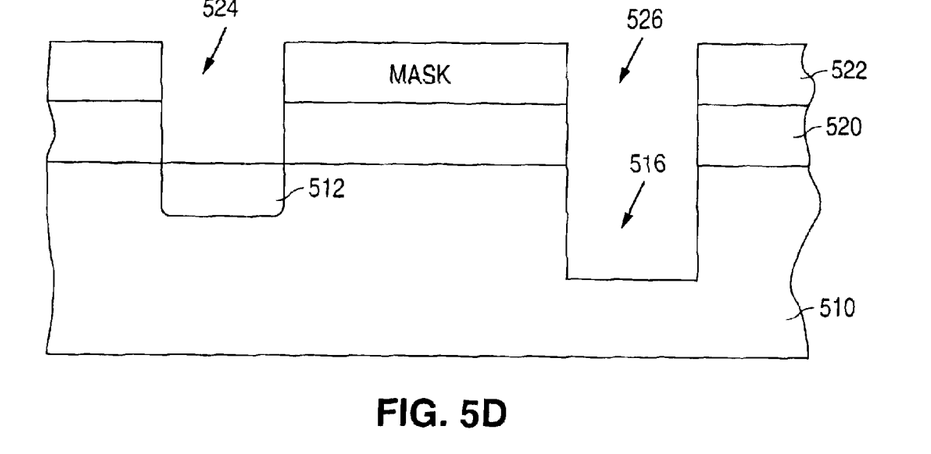

Following the formation of insulation layer 520, a layer of masking material 522 is formed on insulation layer 520. As shown in FIG. 5C, material 522 is then patterned to expose doped region 512 and trench 516. Referring to FIG. 5D, once masking material 522 has been patterned, the exposed regions of insulation material 520 are etched until insulation material 520 is removed from the surfaces of doped region 512 and trench 516. The etch forms a contact opening 524 in insulation layer 520 that exposes doped region 512 and a trench opening 526 that exposes trench 516. Following the etch, masking material 522 is removed.

Figure 5E:
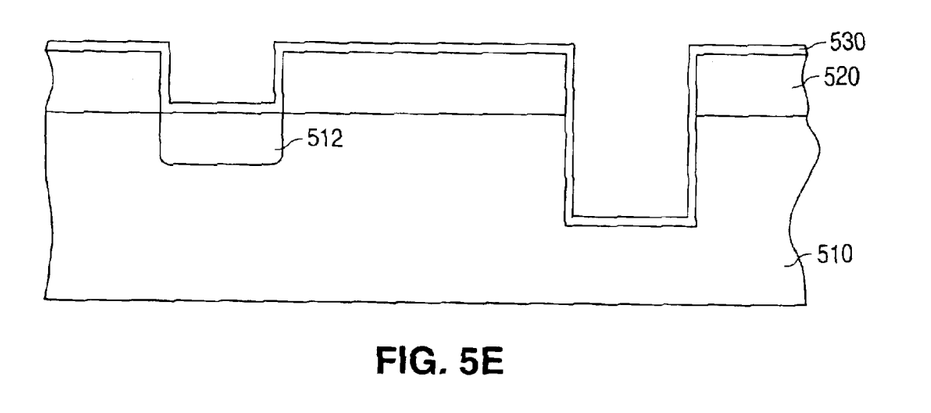

Next, as shown in FIG. 5E, a layer of contact protection material 530 is deposited on doped region 512, trench 516, and insulation layer 520. After material 530 has been deposited, wafer 510 is heated to a low temperature (e.g., 250–400° C.) in a neutral ambient, such as N2, for a predetermined period of time.

Figure 5F:
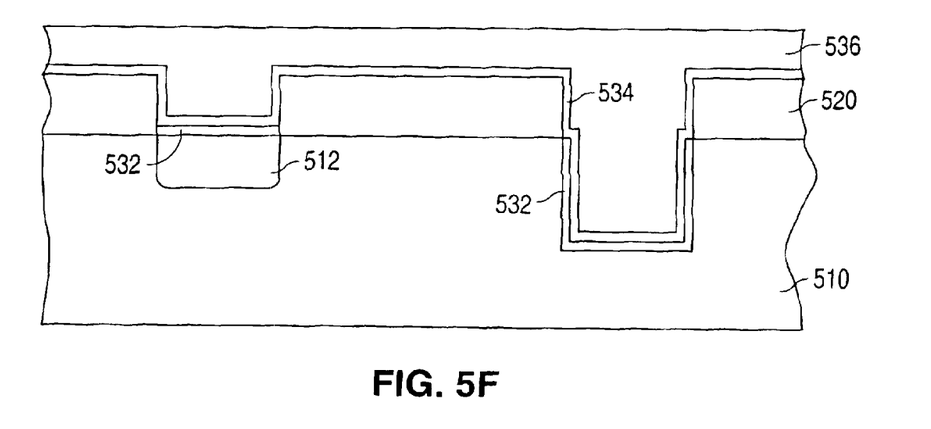

As shown in FIG. 5F, the heat cycle causes the contact protection material 530 that is in contact with doped region 512 and trench 516 to react with the silicon and form a layer of metal silicide 532 on the surface of doped region 512 and trench 516. For example, metal silicide layer 532 can be implemented with platinum silicide, cobalt silicide, or titanium silicide. The unreacted contact protection material 530 (the material in contact with insulation layer 520) is then removed.

After metal silicide layer 532 has been formed on the surfaces of doped region 512 and trench 516, a layer of diffused barrier material 534 is formed on metal silicide layer 532 and insulation layer 520. Diffusion barrier material 534 can be implemented with, for example, titanium, titanium-tungsten, titanium nitride, and tungsten. Following this, a layer of electrically-conductive contact material 536, such as aluminum, is formed on layer 534.

Figure 5G:
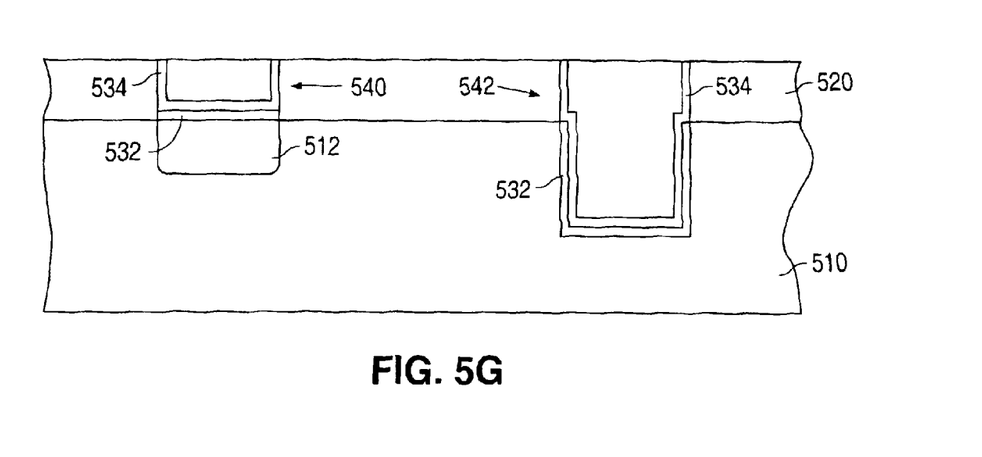

As shown in FIG. 5G, once contact material 536 has been formed, contact material 536 and then diffused barrier material 534 are planarized to remove material 534 from the top surface of insulation layer 520. Materials 534 and 536 can be planarized using, for example, chemical-mechanical polishing (CMP) and etch back techniques. The etch forms a conductive contact 540 that makes an electrical connection with doped region 512. The etch also forms a conductive contact 542 that extends well into wafer 510.

Figure 5H:
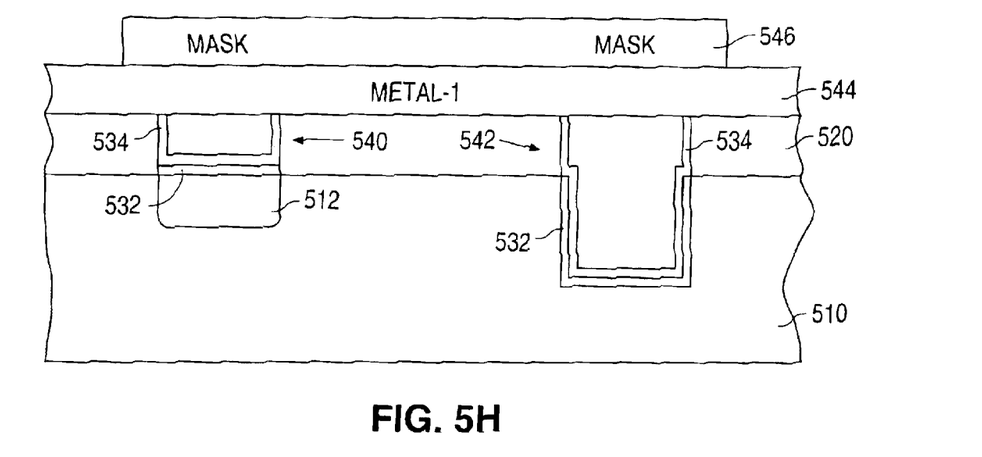
Figure 5I:
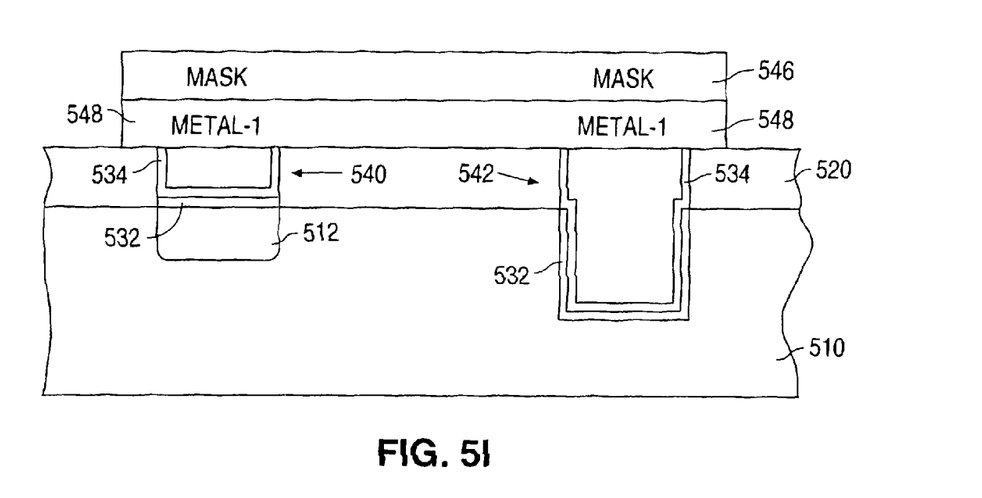

Referring to FIG. 5H, following the etch, a first layer of metal (metal-1) 544 is formed on insulation layer 520, contact 540, and contact 542. After metal-1 layer 544 has been deposited, a first metal trace mask 546 is formed and patterned on metal-1 layer 544. Referring to FIG. 5I, following the patterning of mask 546, the exposed portion of metal-1 layer 544 is etched until metal-1 layer 544 is removed from the surface of the underlying insulation layer 520. Mask 546 is then removed. The etch defines a first metal-1 trace 548 and exposes regions of insulation layer 520.

Figure 5J:
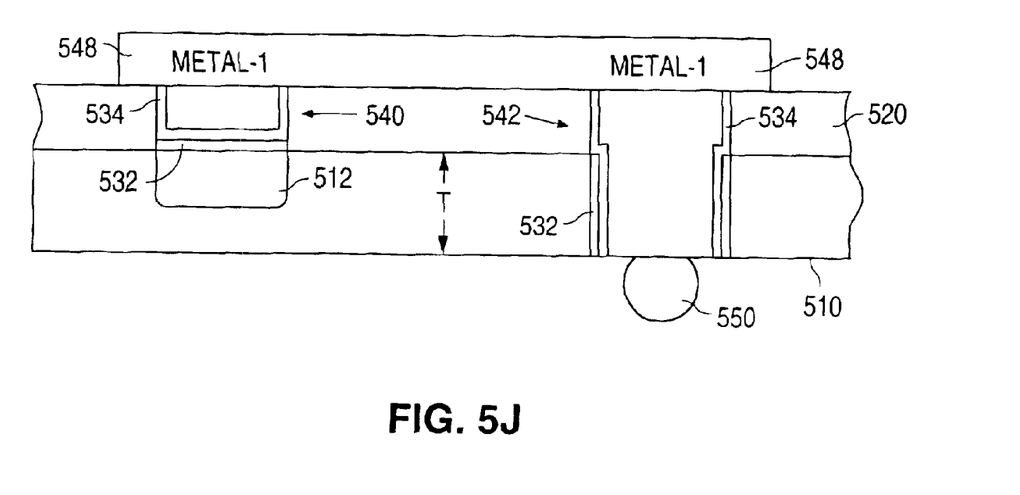

Referring to FIG. 5J, after a number of additional interconnecting metal layers and vias are formed (not shown), the bottom side of wafer 510 is ground down so that wafer 510 has a thickness T that is less than the depth D of trench 516. For example, current-generation back grinding equipment can reduce the thickness T to approximately one mil. At this thickness, wafer 510 can be deformed. The back grinding exposes contact 542 on the bottom side of wafer 510. Once contact 542 has been exposed, solder bumps 550 are then formed on contact 542 adjacent to the bottom side of wafer 510. (In addition to solder, solder bumps 550 can alternately be implemented with other adhesives that provide an electrical and mechanical connection between photo-sensing layer 216 and interconnect layer 214.)

Figure 6:
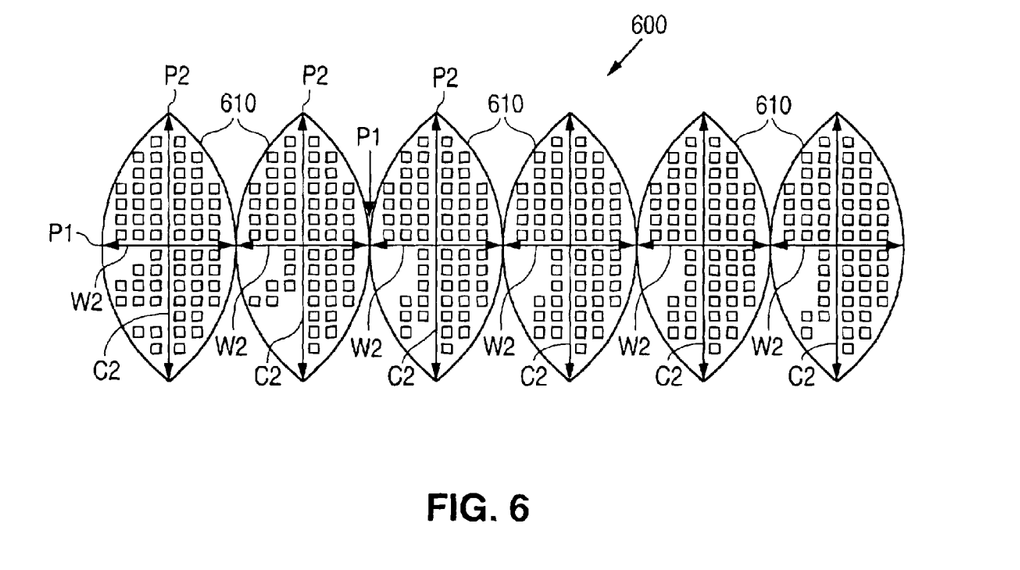
FIG. 6 is a plan view illustrating an example of an interconnect layer 600 in accordance with the present invention.

FIG. 6 shows a plan view that illustrates an example of an interconnect layer 600 in accordance with the present invention. As shown in FIG. 6, interconnect layer 600 includes a series of adjacent interconnect sections 610. When adjacent interconnect sections 610 are connected together, and the first and last interconnect sections 610 are connected together, the connected sections 610 form a sphere.

Each interconnect section 610 is similarly shaped as photo-sensing section 310, and has a maximum width line W2, and a centerline C2 that passes through the center of the maximum width line W2, and is normal to, and longer than, the maximum width line W2. In addition, each section 610 has a curved edge that runs from a point P1 at an end of the maximum width line W2, to a point P2 at an end of the centerline C2.

Figure 7:
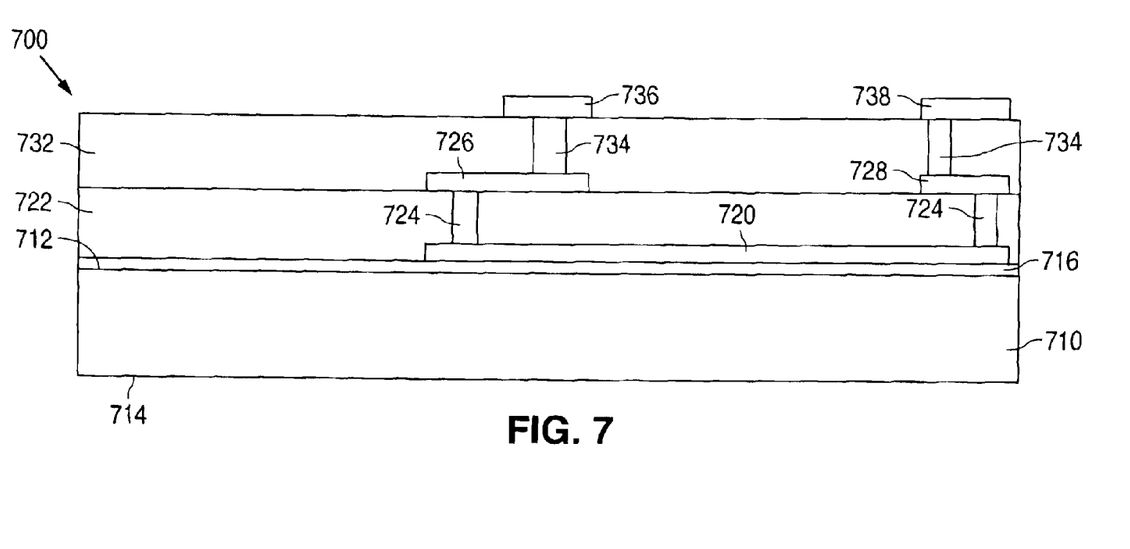
FIG. 7 is a cross-sectional view illustrating an example of an interconnect section 700 in accordance with the present invention.

FIG. 7 shows a cross-sectional view that illustrates an example of an interconnect section 700 in accordance with the present invention. As shown in FIG. 7, interconnect section 700 includes a semiconductor wafer 710 with a top surface 712 and a bottom surface 714. Wafer 710 is very thin and can be, for example, approximately one mil thick.

As further shown in FIG. 7, interconnect section 700 also includes a layer of isolation material 716 that is formed on the top surface 712 of wafer 710, and a number of metal-1 traces, including a metal-1 trace 720, that are formed on isolation layer 716. (Isolation layer 716 can optionally be omitted.)

Interconnect section 700 additionally includes a layer of isolation material 722 is that formed on metal-1 trace 720, and a number of vias 724 that are formed through isolation layer 722 to make an electrical connection with the metal-1 traces, such as metal-1 trace 720. Further, a number of metal-2 traces, including metal-2 traces 726 and 728, are formed on isolation layer 722 to make electrical connections with vias 724.

Further, interconnect section 700 includes a layer of isolation material 732 is that formed on metal-2 traces 726 and 728, and a number of vias 734 that are formed through isolation layer 732 to make an electrical connection with the metal-2 traces, such as metal-2 traces 726 and 728. Further, a number of metal pads, including pads 736 and 738, are formed on isolation layer 732 to make electrical connections with vias 734.

Figure 8A:
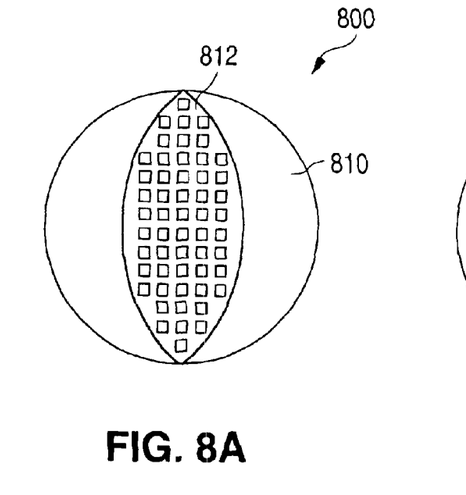
FIGS. 8A–8B are perspective views illustrating a method of forming an imaging sphere 800 in accordance with the present invention.
Figure 8B:
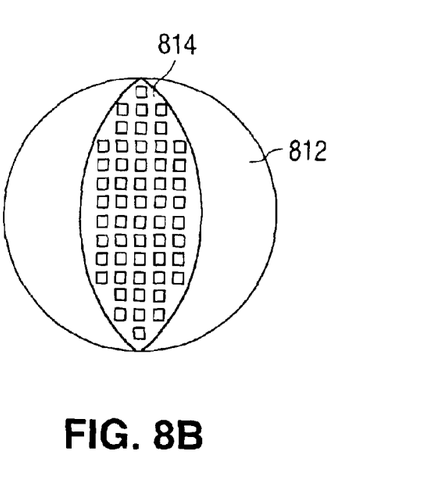

FIGS. 8A–8B show perspective views that illustrate a method of forming an imaging sphere 800 in accordance with the present invention. As shown in FIG. 8, the method, which utilizes a spherical core 810, begins by adhering an interconnect section 812 to core 810. Additional interconnect sections 812 are adhered to core 810 until core 810 is covered. (Adjacent interconnect sections 812 can touch each other or be spaced apart from each other.)

Following this, as shown in FIG. 8B, a photo-sensing section 814 is connected to an interconnect section 812 so that the solder bumps on photo-sensing section 814 match the pads on interconnect section 812. Additional photo-sensing sections 814 are connected to the remaining interconnect sections 812 until the interconnects sections 812 are covered. (Adjacent photo-sensing sections 814 can touch each other or be spaced apart from each other, depending on the interconnect section 812.)

Figure 9:
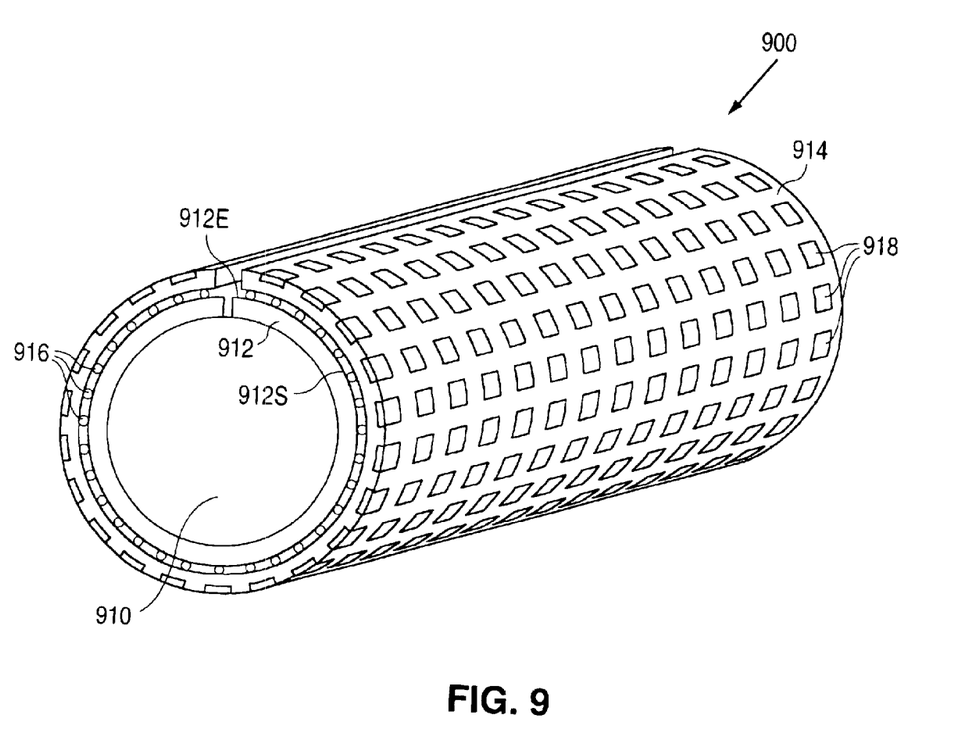
FIG. 9 is a perspective view illustrating an example of a tubular image sensor 900 in accordance with the present invention.

FIG. 9 shows a perspective view that illustrates an example of a tubular image sensor 900 in accordance with the present invention. As shown in FIG. 9, tubular image sensor 900 includes a tubular core 910, and an inner interconnect layer 912 that is adhered to the convex surface of tubular core 910. Interconnect layer 912 routes voltages and signals from a surface region 912S to an external connection region 912E.

In addition, image sensor 900 includes a photo-sensing layer 914 that is connected to the surface region 912S of interconnect layer 912 via a number of solder bumps 916. (In addition to solder, solder bumps 916 can alternately be implemented with other adhesives that electrically and mechanically connect photo-sensing layer 914 to interconnect layer 912.) Photo-sensing layer 914 includes a number of photocells 918 that output voltages that correspond to the intensity of light received by the photocells 918.

Photo-sensing layer 914 and interconnect layer 912 are the same as photo-sensing layer 216 and interconnect layer 214 except that photo-sensing layer 914 and interconnect layer 912 are formed in square or rectangular sheets. Interconnect layer 912 is formed around tubular core 910 by adhering a single sheet around tubular core 910. Alternately, tubular core 910 can be covered with multiple sheets of interconnect layer 912, such as two sheets that each cover approximately one-half of the tubular surface.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. An image sensor comprising:
   a core structure having a convex surface;
   an interconnect layer adhered to the convex surface of the core structure, the interconnect layer routing voltages and signals from a surface region to an external connection region;
   and
   a photo-sensing layer electrically connected to the surface region of the interconnect layer, the photo-sensing layer including a single substrate and a plurality of photocells formed in the single substrate that output voltages that correspond to an intensity of light received by the photocells, the single substrate covering a majority of the convex surface.

2. The convex image sensor of claim 1 wherein the interconnect layer includes:
   an interconnect wafer;

a first metal layer formed over the interconnect wafer;

a layer of isolation material formed on the first metal layer over the interconnect wafer; and a plurality of vias formed through the layer of isolation material, a via of the plurality of vias being formed through the layer of isolation material to make an electrical connection with the first metal layer.

3. The convex image sensor of claim 2 wherein the interconnect layer includes a plurality of interconnect sections that are adhered to the core structure.

4. The convex image sensor of claim 3 wherein adjacent interconnect sections touch each other.

5. The convex image sensor of claim 3 wherein adjacent interconnect sections do not touch each other.

6. The convex image sensor of claim 4 wherein the core structure is spherical.

7. The convex image sensor of claim 6 wherein an interconnect section has a maximum width line, a center line that passes through a center of the maximum width line, and is normal to, and longer than, the maximum width line.

8. The convex image sensor of claim 2 wherein the interconnect layer is a single sheet that is adhered to the core structure.

9. The convex image sensor of claim 1 wherein the core structure is tubular.

10. The convex image sensor of claim 1 wherein the photo-sensing layer includes:

a photo-sensing wafer having a first conductivity type, a top surface, and a bottom surface, the plurality of photocells being formed in and on the top surface of the photo-sensing wafer;

a layer of insulation material formed on the photo-sensing wafer; and a contact formed through the photo-sensing wafer and the layer of insulation material, the contact being electrically connected to a photocell.

11. The convex image sensor of claim 10 and further comprising a solder bump connected to the contact adjacent to the bottom surface of the wafer.

12. The convex image sensor of claim 10 wherein the photo-sensing layer includes a plurality of photo-sensing sections.

13. The convex image sensor of claim 12 wherein adjacent photo-sensing sections touch each other.

14. The convex image sensor of claim 13 wherein the core structure is spherical.

15. The convex image sensor of claim 10 wherein the photo-sensing layer is a single sheet that is connected to the interconnect layer.

16. The convex image sensor of claim 10 wherein the core structure is tubular.

17. The convex image sensor of claim 10 and further comprising a solder bump connected to the contact adjacent to the bottom surface of the wafer, and to the interconnect layer.

18. The convex image sensor of claim 10 wherein the photo-sensing wafer has a convex surface.

19. A method of forming an image sensor, the method comprising the steps of:

forming a core structure having a convex surface;

adhering an interconnect layer to the convex surface of the core structure, the interconnect layer routing voltages and signals from a surface region to an external connection region; and electrically connecting a photo-sensing layer to the surface region of the interconnect layer, the photo-sensing layer including a single substrate and a plurality of photocells formed in the single substrate that output voltages that correspond to an intensity of light received by the photocells, the single substrate covering a majority of the convex surface.

20. The method of claim 19 wherein the interconnect layer is adhered to the core structure before the photo-sensing layer is connected to the interconnect layer.

21. The method of claim 20 wherein the photo-sensing layer includes:

a photo-sensing wafer having a first conductivity type, a top surface, and a bottom surface;

a plurality of photocells formed in and on the top surface of the photo-sensing wafer;

a layer of insulation material formed on the photo-sensing wafer; and a contact formed through the photo-sensing wafer and the layer of insulation material, the contact being electrically connected to a photocell.

22. The method of claim 21 and further comprising the step of forming a solder bump on the contact adjacent to the bottom surface of the wafer.

23. The method of claim 22 wherein the interconnect layer includes:

an interconnect wafer;

a first metal layer formed over the interconnect wafer;

a layer of isolation material formed on the first metal layer over the interconnect wafer; and a plurality of vias formed through the layer of isolation material, a via of the plurality of vias being formed through the layer of isolation material to make an electrical connection with the first metal layer.

24. A device comprising:

a core structure having a convex surface; and an interconnect layer adhered to the convex surface of the core structure, the interconnect layer routing voltages and signals from a surface region to an external connection region, the interconnect layer having:

an interconnect wafer permanently adhered to the convex surface;

a first metal layer formed over the interconnect wafer;

a layer of isolation material formed on the first metal layer over the interconnect wafer; and a plurality of vias formed through the layer of isolation material, a via of the plurality of vias being formed through the layer of isolation material to make an electrical connection with the first metal layer.

25. The image sensor of claim 24 and further comprising a photo-sensing layer electrically connected to the surface region of the interconnect layer, the photo-sensing layer including a plurality of photocells that output voltages that correspond to an intensity of light received by the photocells.

* * * * *